US009267518B2

(12) United States Patent
Chang

(10) Patent No.: US 9,267,518 B2
(45) Date of Patent: Feb. 23, 2016

(54) HOLDER MECHANISM

(71) Applicant: Taer Innovation Co., Ltd., New Taipei (TW)

(72) Inventor: Cheng-Wen Chang, New Taipei (TW)

(73) Assignee: TAER INNOVATION CO., LTD., New Taipei (TW)

( * ) Notice: Subject to any disclaimer, the term of this patent is extended or adjusted under 35 U.S.C. 154(b) by 0 days.

(21) Appl. No.: 14/675,608

(22) Filed: Mar. 31, 2015

(65) Prior Publication Data

US 2015/0275943 A1    Oct. 1, 2015

(30) Foreign Application Priority Data

Mar. 31, 2014   (TW) .............................. 103205516 U

(51) Int. Cl.
| | |
|---|---|
| *A47G 1/17* | (2006.01) |
| *A47G 29/00* | (2006.01) |
| *F16B 2/12* | (2006.01) |
| *F16M 11/04* | (2006.01) |
| *F16M 11/10* | (2006.01) |
| *F16M 13/02* | (2006.01) |
| *F16B 47/00* | (2006.01) |
| *H05K 5/02* | (2006.01) |
| *B60R 11/00* | (2006.01) |

(52) U.S. Cl.
CPC . *F16B 2/12* (2013.01); *F16B 47/00* (2013.01); *F16M 11/041* (2013.01); *F16M 11/10* (2013.01); *F16M 13/022* (2013.01); *H05K 5/0204* (2013.01); *B60R 2011/0005* (2013.01); *B60R 2011/0026* (2013.01)

(58) Field of Classification Search
CPC ..... F16M 11/00; F16M 11/14; F16M 11/041; F16M 11/10; F16B 47/00; F16B 2/12; B60R 2011/0005
See application file for complete search history.

(56) References Cited

U.S. PATENT DOCUMENTS

| 6,959,899 | B2* | 11/2005 | Yeh ......................... | F16M 11/00 248/316.4 |
|---|---|---|---|---|
| 7,828,259 | B2* | 11/2010 | Wang ...................... | B60R 11/02 248/316.4 |
| 2007/0262223 | A1* | 11/2007 | Wang .................. | B60R 11/0241 248/346.07 |
| 2009/0189033 | A1* | 7/2009 | Lin ......................... | F16B 47/00 248/205.5 |
| 2013/0174660 | A1 | 7/2013 | Imasaka et al. | |
| 2013/0277521 | A1 | 10/2013 | Hiramoto et al. | |

FOREIGN PATENT DOCUMENTS

| WO | WO 2010127821 A1 | 11/2010 |
|---|---|---|
| WO | WO 2013074626 A1 | 5/2013 |

* cited by examiner

*Primary Examiner* — Amy Sterling
(74) *Attorney, Agent, or Firm* — Li & Cai Intellectual Property (USA) Office

(57) ABSTRACT

A holder mechanism for holding a handheld device is provided which includes a holder base and a gripping assembly. The gripping assembly is movably mounted on the holder base. The gripping assembly includes an elastic element, a first gripping module, and a second gripping module. The elastic element has a first end fixed to the first gripping module and a second end fixed to the second gripping module. Whereby, the second gripping module can move relative to the first gripping module to grip the handheld device when the elastic element is elastically deformed to apply a resilient force to the second gripping module.

9 Claims, 12 Drawing Sheets

HOLDER MECHANISM

BACKGROUND OF THE INVENTION

1. Field of the Invention

The instant disclosure relates to a holding device; in particular, to a holder mechanism for holding a handheld device.

2. Description of Related Art

In the recent years, handheld devices such as mobile phones and tablets have become common. Generally, when using a smart phone or a tablet PC, the user needs to hold the device in one hand and to operate it in another hand. If the handheld device is put on a table, the device is usually laid flat on the table, so that the handheld device is difficult to be read by the user. In addition, handheld devices are not only used while walking or standing, but also in receiving phone calls and navigating directions while driving via setting the device in a car or a motorbike using a handheld device holder.

Since most of the handheld device holders on the market cannot fit all handheld devices with different shapes or sizes, they have small applicability. The users need to choose a specific holder to set their hand held devices on it depending upon different types. Furthermore, previous handheld device holders have complex configurations and parts, so as to increase some operating problems for the users.

SUMMARY OF THE INVENTION

The object of the instant disclosure is to provide a holder mechanism, of which a gripping assembly is independently, selectively operable to grip and release a handheld device, such that the handheld device can be automatically retained in multiple gripping configurations by operation of the gripping assembly.

In order to achieve the aforementioned objects, according to an embodiment of the instant disclosure, the holder mechanism for holding a handheld device comprises a holder base and a gripping assembly. The gripping assembly is movably mounted on the holder base. The gripping assembly includes an elastic element, a first gripping module, and a second gripping module. A first end of the elastic element is fixed to the first gripping module, and a second end of the elastic element is fixed to the second gripping module. The elastic element is configured to apply a resilient force to the second gripping module to drive the second gripping module to move relative to the first gripping module to grip the handheld device.

Base on the above, the holder mechanism including a pair of gripping assemblies with an elastic element connected therebetween can provide users with a simple way to install a handheld device thereon. When the second gripping module is pulled away from the first gripping module, a resilient force generated by the stretched elastic element will drive the second gripping module to move relative to the first gripping module to grip the handheld device.

In order to further appreciate the characteristics and technical contents of the instant disclosure, references are hereunder made to the detailed descriptions and appended drawings in connection with the instant disclosure. However, the appended drawings are merely shown for exemplary purposes, rather than being used to restrict the scope of the instant disclosure.

DETAILED DESCRIPTION OF THE PREFERRED EMBODIMENTS

The aforementioned illustrations and following detailed descriptions are exemplary for the purpose of further explaining the scope of the instant disclosure. Other objectives and advantages related to the instant disclosure will be illustrated in the subsequent descriptions and appended drawings.

Figure 1A:
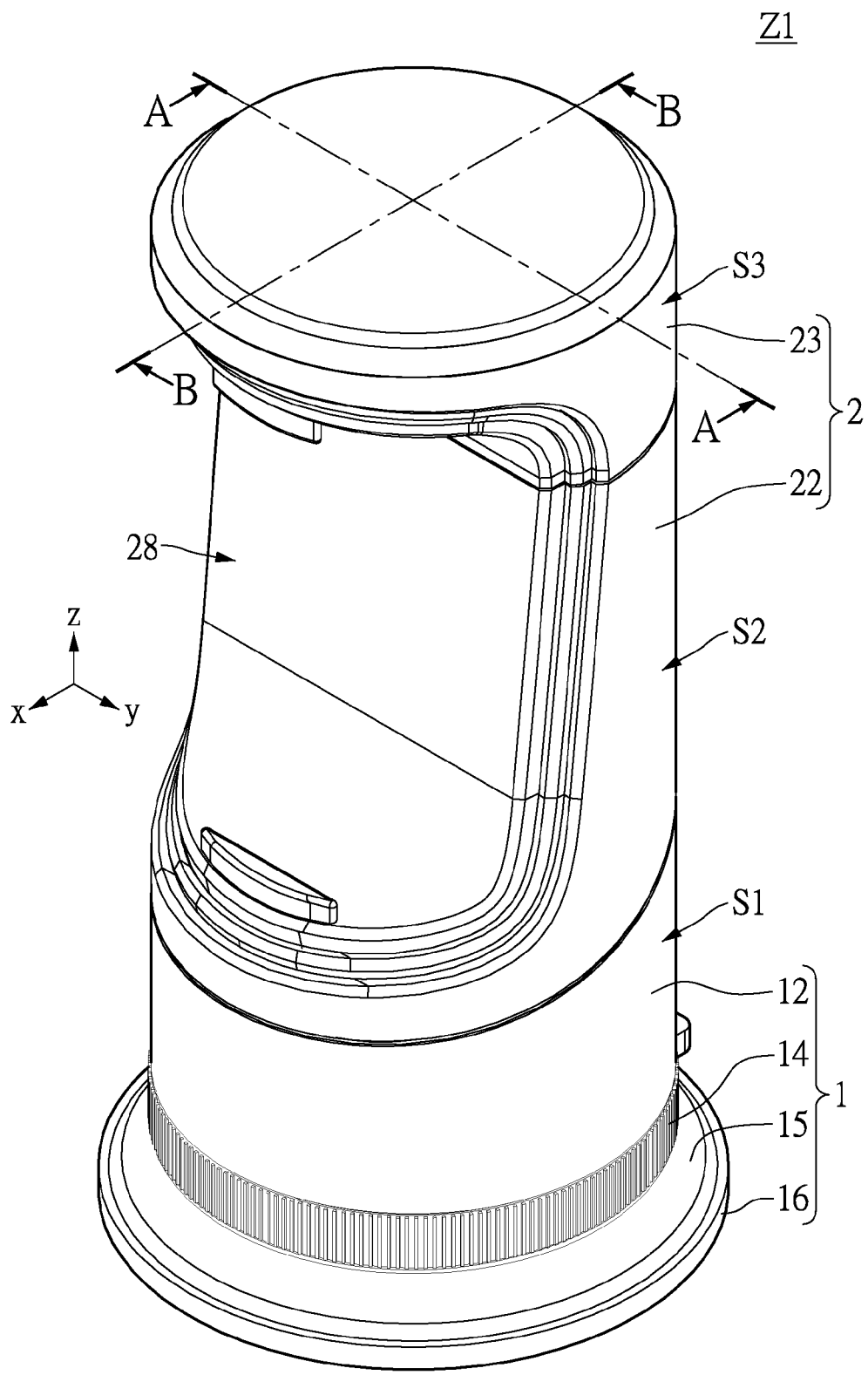
FIGS. 1A and 1B are perspective views of a holder mechanism according to a first embodiment of the present invention.
Figure 1B:
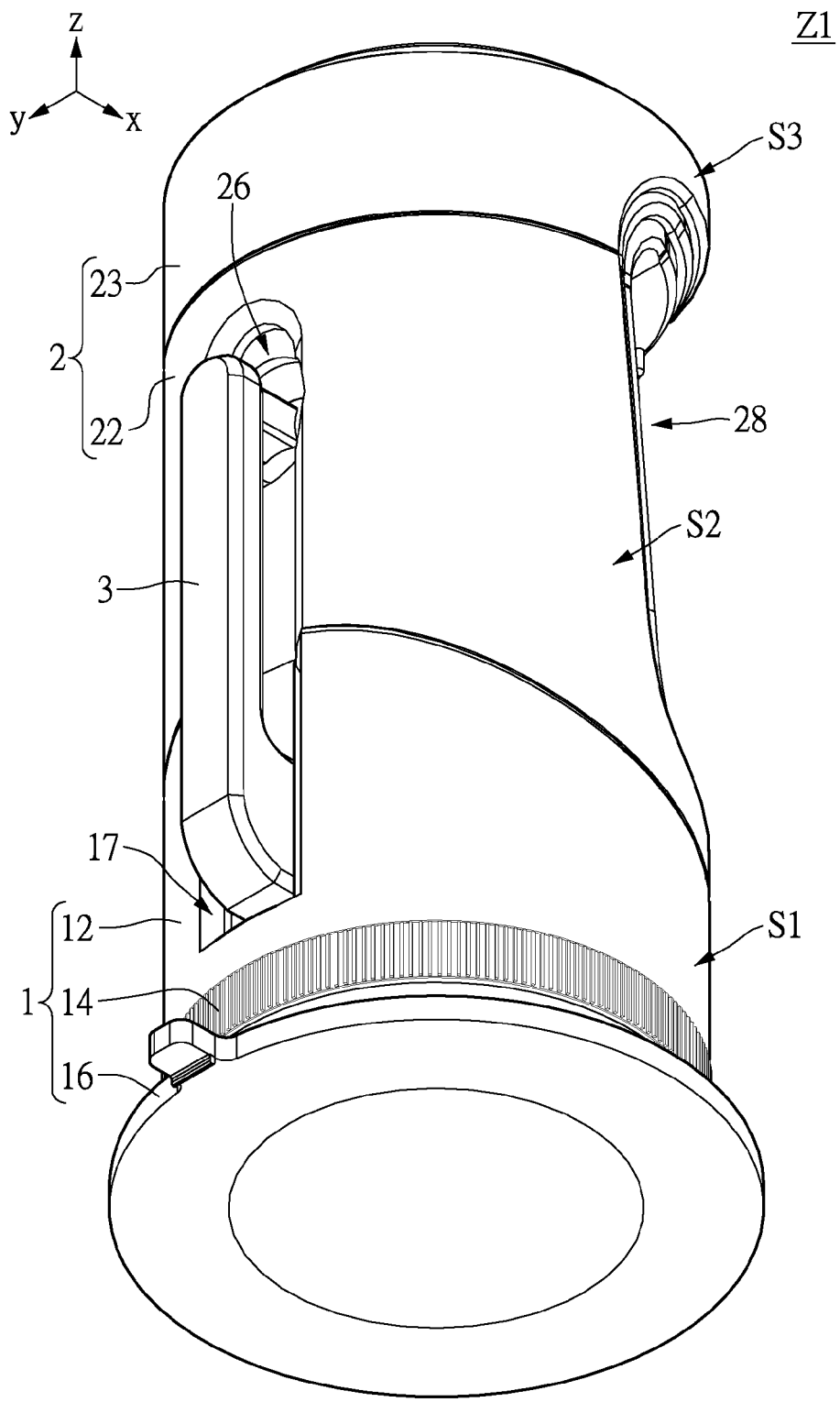
Figure 2A:
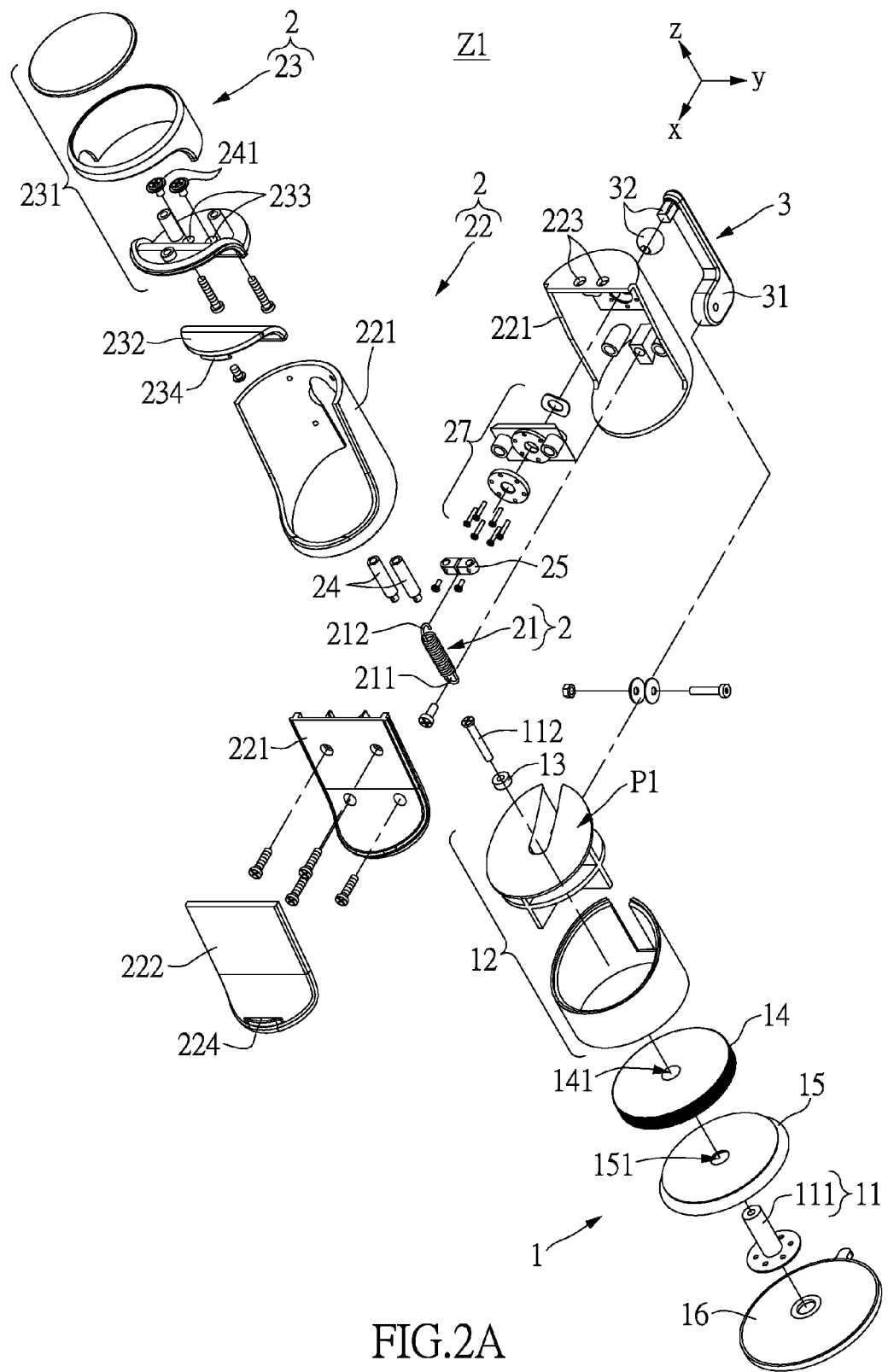
FIGS. 2A and 2B are exploded views of a holder mechanism according to the first embodiment of the present invention.
Figure 2B:
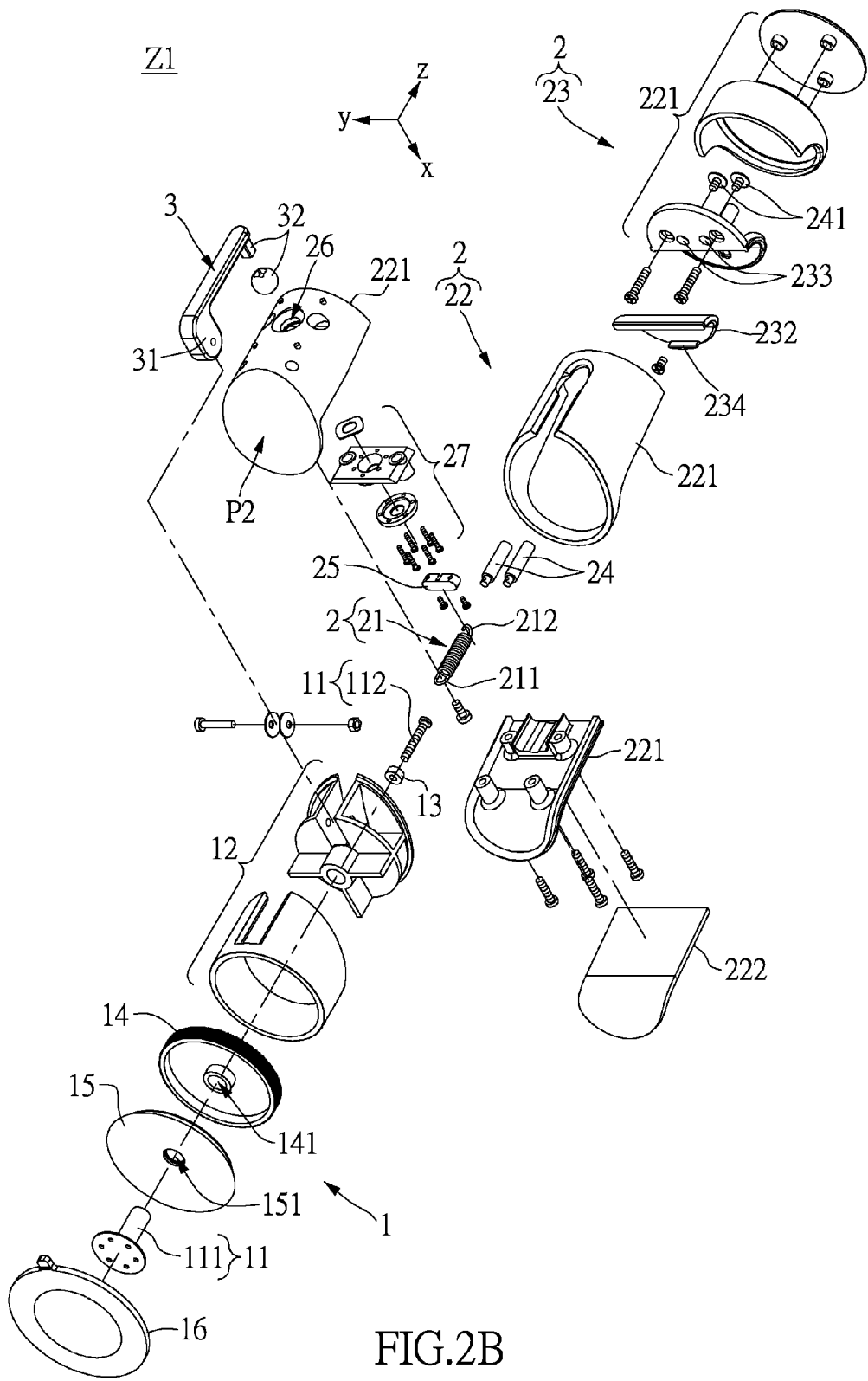

Please refer to FIGS. 1A to 2B. FIGS. 1A and 1B are perspective views of a holder mechanism according to a first embodiment of the present invention. FIGS. 2A and 2B are exploded views of a holder mechanism according to the first embodiment of the present invention. The holder mechanism Z1 is configured for holding a handheld device W1 (as shown in FIG. 5), including a holder base 1, a gripping assembly 2, and a connecting bar 3. The gripping assembly 2 is mounted on the holder base 1 via the connecting bar 3.

The holder mechanism Z1 can be fixed to surface of an object by the holder base 1. The object, for example, can be a work table or an instrument desk of an automobile. The holder base 1 includes a positioning element 11, a casing 12, and a bearing structure 13. The casing 12 and the bearing structure 13 are sleeved on the positioning element 11, such that the casing 12 can be independently rotated relative to the positioning element 11 along a common vertical axis. Specifically, the casing 12 is installed on and around the bearing structure 13, configured to fittingly couple to the outer ring (not shown) of the bearing structure 13. Similarly, the positioning element 11 is configured to fittingly couple to the inner ring (not shown) of the bearing structure 13. Accordingly, the positioning element 11 cannot be driven by the casing 12 to rotate. That is, the positioning element 11 is in a stationary state to support the casing 12.

For the instant embodiment, the positioning element 11 includes a positioning column 111 and an anchor bolt 112. The positioning column 111 has a fixing-hole opening at the top end and extending downwardly for engagement with the anchor bolt 112. The bearing structure 13 is installed on and around the top end of the anchor bolt 112.

Moreover, below the holder base 1 there are arranged a suction disc 16 and an actuating disc 14 which is positioned above the suction disc 16. Specifically, the suction disc 16, as shown in the figures, is connected to the bottom end of the positioning column 111. The actuating disc 14 has an index hole 141, by which the actuating disc 14 is sleeved on the lower portion of the positioning column 111. To further explain the details, the bottom end of the positioning column 111 is formed with a first engaging structure (not shown). The actuating disc 14 has a second engaging structure (not shown) formed around the periphery of the index hole 141 for engagement with the first engaging structure of the positioning column 111. Accordingly, the actuating disc 14 can be independently rotated relative to the positioning column 111, and allowed to move downwardly to push the suction disc 16. Therefore, the suction disc 16 can be deformed by the actuating disc 14 to produce a suction force to retain the holder base 1 on an object surface. In various embodiments, the holder base 1 can be retained on the object surface by an adhesive layer.

Further, between the actuating disc 14 and the suction disc 16 there is arranged a pressing disc 15 for deforming the suction disc 16. The pressing disc 15 has an index hole 151, by which the pressing disc 15 is sleeved on the lower portion of the positioning column 111. Please note that the pressing disc 15 and the positioning column 111 are not in a manner of a tight fit. Thus, the pressing disc 15 can be driven to axially move together with the actuating disc 14 to deform the suction disc 16.

Figure 3A:
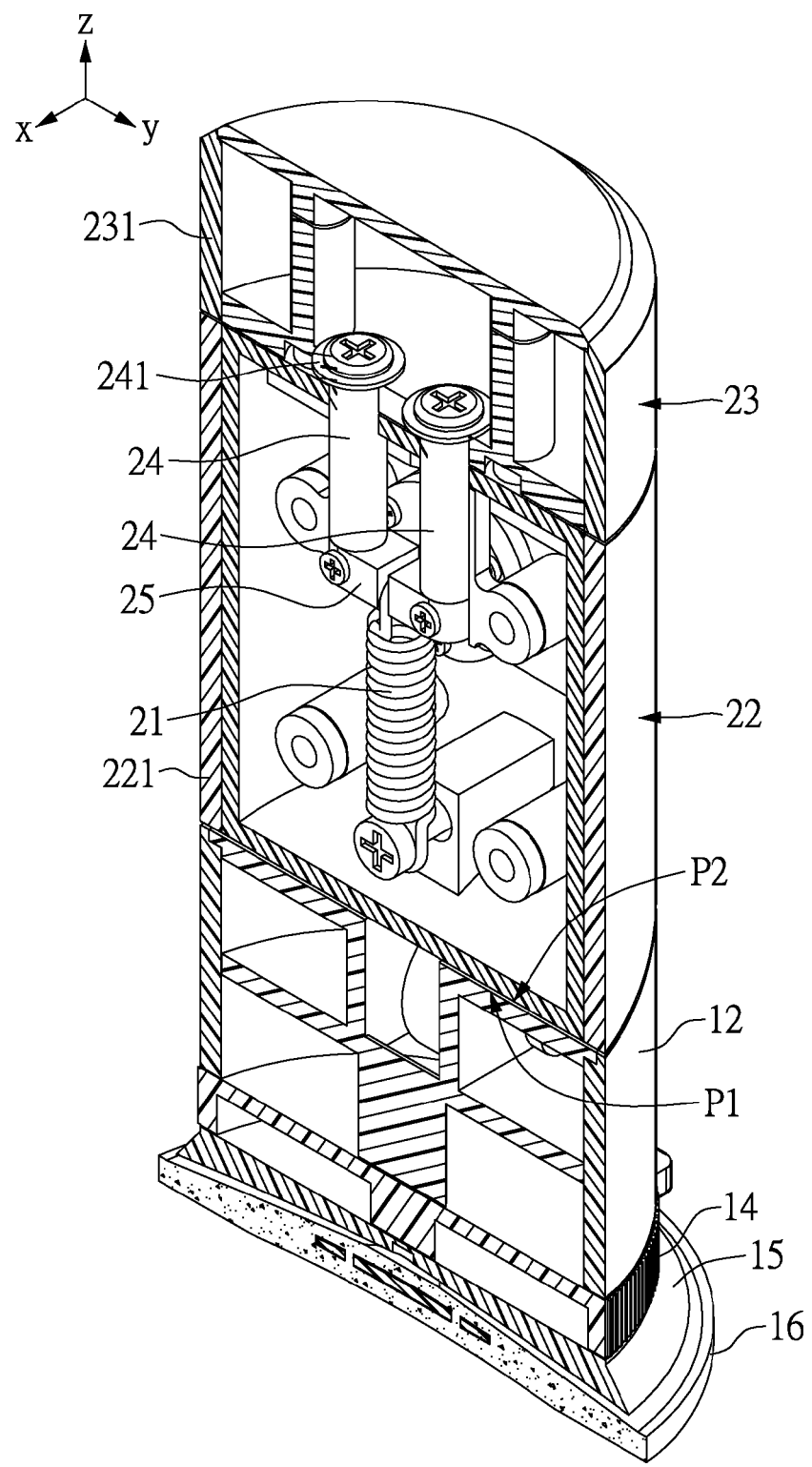
FIG. 3A is a partial stereogram of a holder mechanism shown in FIG. 1A taken along line A-A'.
Figure 3B:
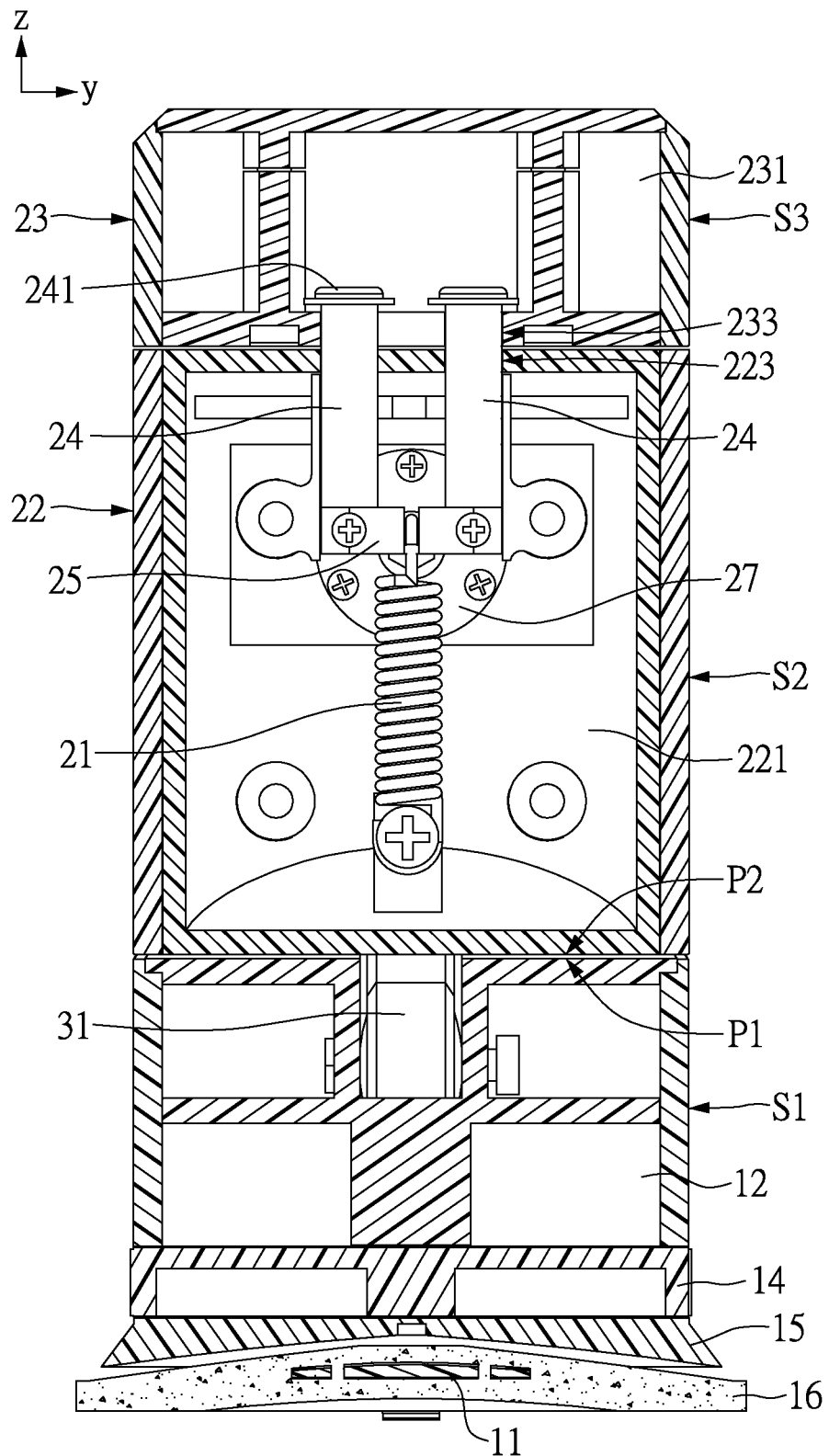
FIG. 3B is a cross-sectional view of a holder mechanism shown in FIG. 1A taken along line A-A'.

Please refer to FIGS. 3A and 3B. FIG. 3A is a partial stereogram of a holder mechanism shown in FIG. 1A taken along line A-A'. FIG. 3B is a cross-sectional view of a holder mechanism shown in FIG. 1A taken along line A-A'. The gripping assembly 2 includes an elastic element 21, a first gripping module 22, a second gripping module 23, and two guide elements 24. The first gripping module 22 and the second gripping module 23 are connected to each other via the elastic element 21 and the guide elements 24.

Specifically, the first gripping module 22 has a first gripping body 221, and the second gripping module 23 has a second gripping body 231. The elastic element 21 is arranged inside the first gripping body 221. A first end 211 of the elastic element 21 is connected to the first gripping body 221 by at least one screw element. A second end 212 of the elastic element 21 is connected to the second gripping module 23 via the guide elements 24.

To further explain the details, the first gripping body 221 is formed with two first through-holes 223, and the second gripping body 231 is formed with two second through-holes 233 corresponding to the first through-holes 223 respectively. One of the guide elements 24 passes through a pair of first and second through-holes 223, 233 and is fixed to a retaining element 25. Similarly, another one of the guide elements 24 passes through another pair of first and second through-holes 223, 233 and is fixed to the retaining element 25. The second end 212 of the elastic element 21 is hung on the retaining element 25. Accordingly, the guide elements 24 can be cooperated with the elastic element 21.

Each of the guide elements 24 has a head unit 241 which is disposed on an inner surface of the second gripping body 231. The pore diameter of each of the first and second through-holes 223, 233 are smaller than the outer diameter of each of the head units 241. Thus, the elastic element 21 retained in a predetermined horizontal plane by the retaining element 25 can be coupled to the second gripping body 231 via the head units 241 of the guide elements 24. For the instant embodiment, the top of the guide element 24 is formed with a fixing-hole. The head unit, i.e. screw, is engaged in the fixing-hole.

Figure 5A:
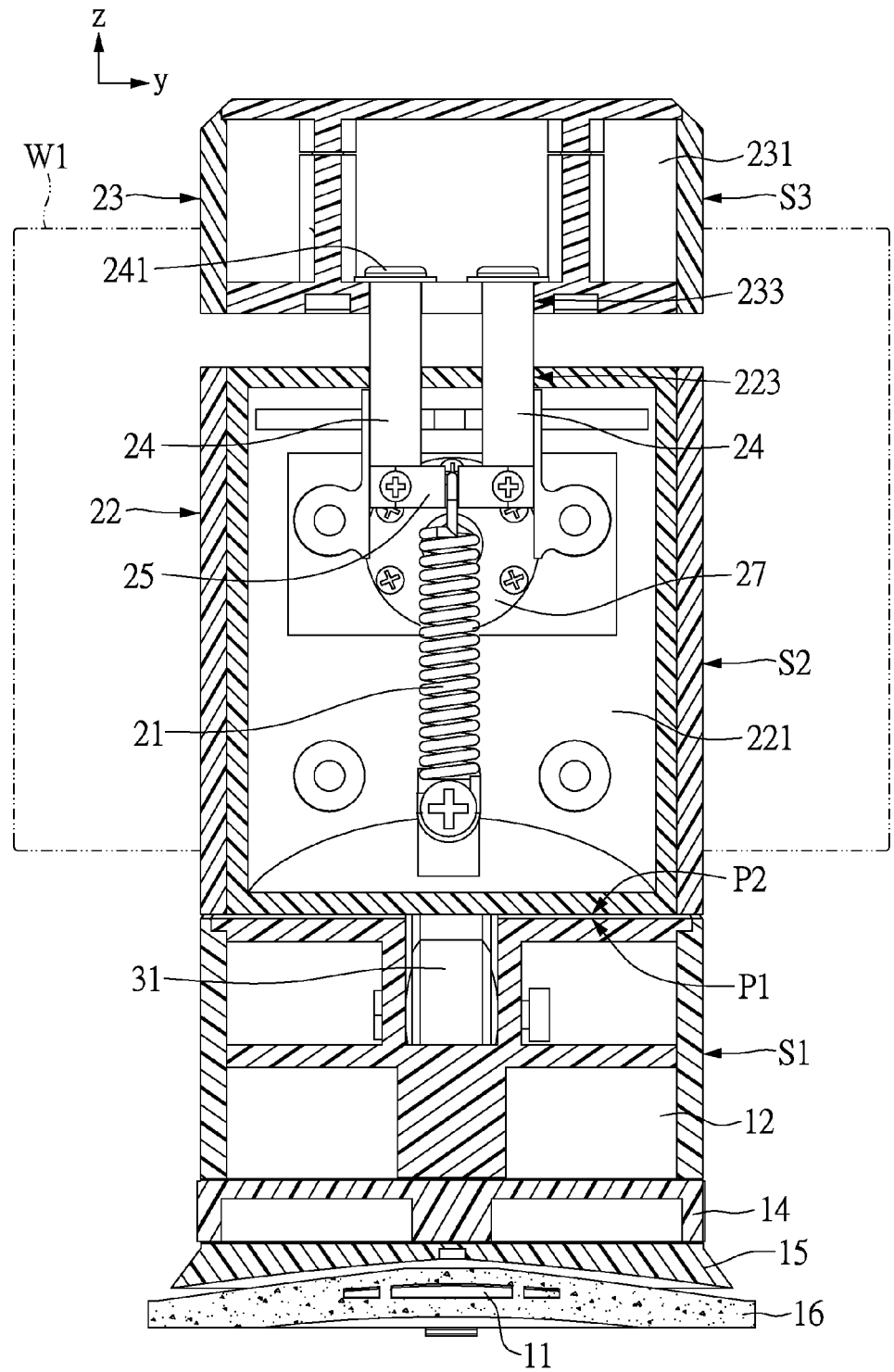
FIG. 5A is a cross-sectional view of a holder mechanism shown in FIG. 1A taken along line A-A'.
Figure 5B:
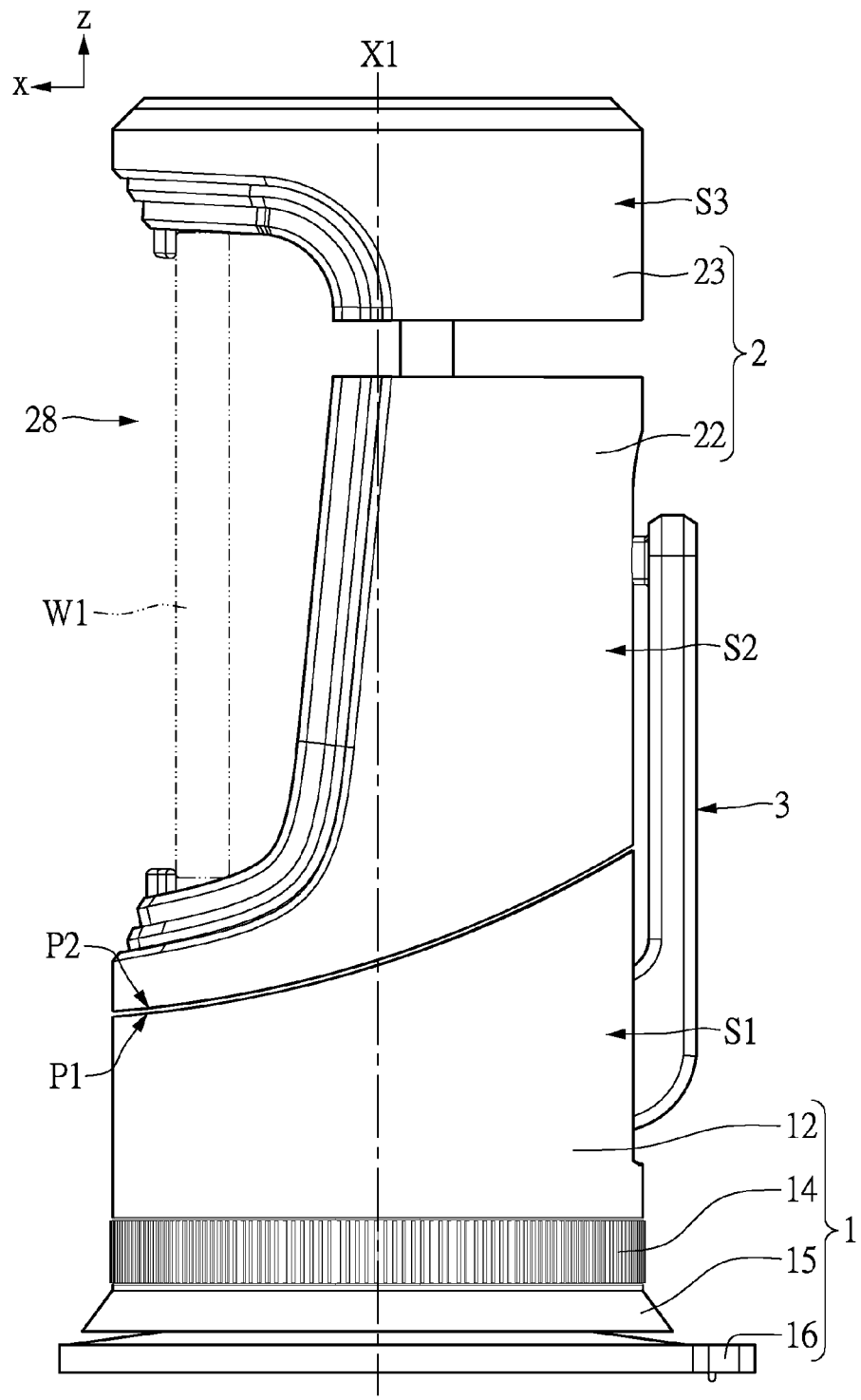
FIG. 5B is a side view showing a use state of a holder mechanism shown in FIG. 1A.

Please refer to FIGS. 5A and 5B. FIG. 5A is a cross-sectional view of a holder mechanism shown in FIG. 1A taken along line A-A'. FIG. 5B is a side view showing a use state of a holder mechanism shown in FIG. 1A. When the second gripping module 23 is pulled away from the first gripping module 22, a resilient force generated by the stretched elastic element 21 will drive the second gripping module 23 to move relative to the first gripping module 22 to grip the handheld device W1. Thus, the handheld device W1 can be retained by the gripping assembly 2.

Where a process status moving the first gripping module 22 away from or towards the second gripping module 23, the guide elements 24 can move reciprocally only along the z-axis through the first and second through-holes 223, 233.

For the instant embodiment, the holder base 1 is of a cylinder shape. That is, the holder base 1 has a circular exterior surface S1. The first and second gripping bodies 221, 231 each are of a cylinder shape. That is, the first gripping body 221 has a circular exterior surface S2, and the second gripping body 231 has a circular exterior surface S3. The exterior surface S2 of the first gripping body 221 is flush with the exterior surface S3 of the second gripping body 231, such that the gripping assembly 2 is of a cylinder shape.

The gripping assembly 2 has a recess 28 formed at the exterior surface S2 for accommodating a handheld device W1. The first gripping module 22 includes a first soft spacer 222, and the second gripping module 23 includes a second soft spacer 233. The first and second soft spacers 222, 223 are arranged in the recess 28. The first gripping module 22 can further include a first protrusion 224, and the second gripping module 23 can further include a second protrusion 234. The first and second protrusions 224, 234 are arranged around the recess 28 to abut against the handheld device W1.

Referring again to FIG. 5B, when the gripping assembly 2 is at a first position opposite to the holder base 1, the exterior surfaces S2, S3 of the gripping assembly 2 are flush with the exterior surface S1 of the holder base 1. The holder mechanism Z1 is of a cylinder shape and outside the cylinder there is arranged a connecting bar 3. Moreover, a lower surface P2 of the gripping assembly 2 and the upper surface P1 of the holder base 1 overlap each other and at an angle not equal to 90 degrees with respect to the central axis X1 of the gripping assembly 2.

Figure 4A:
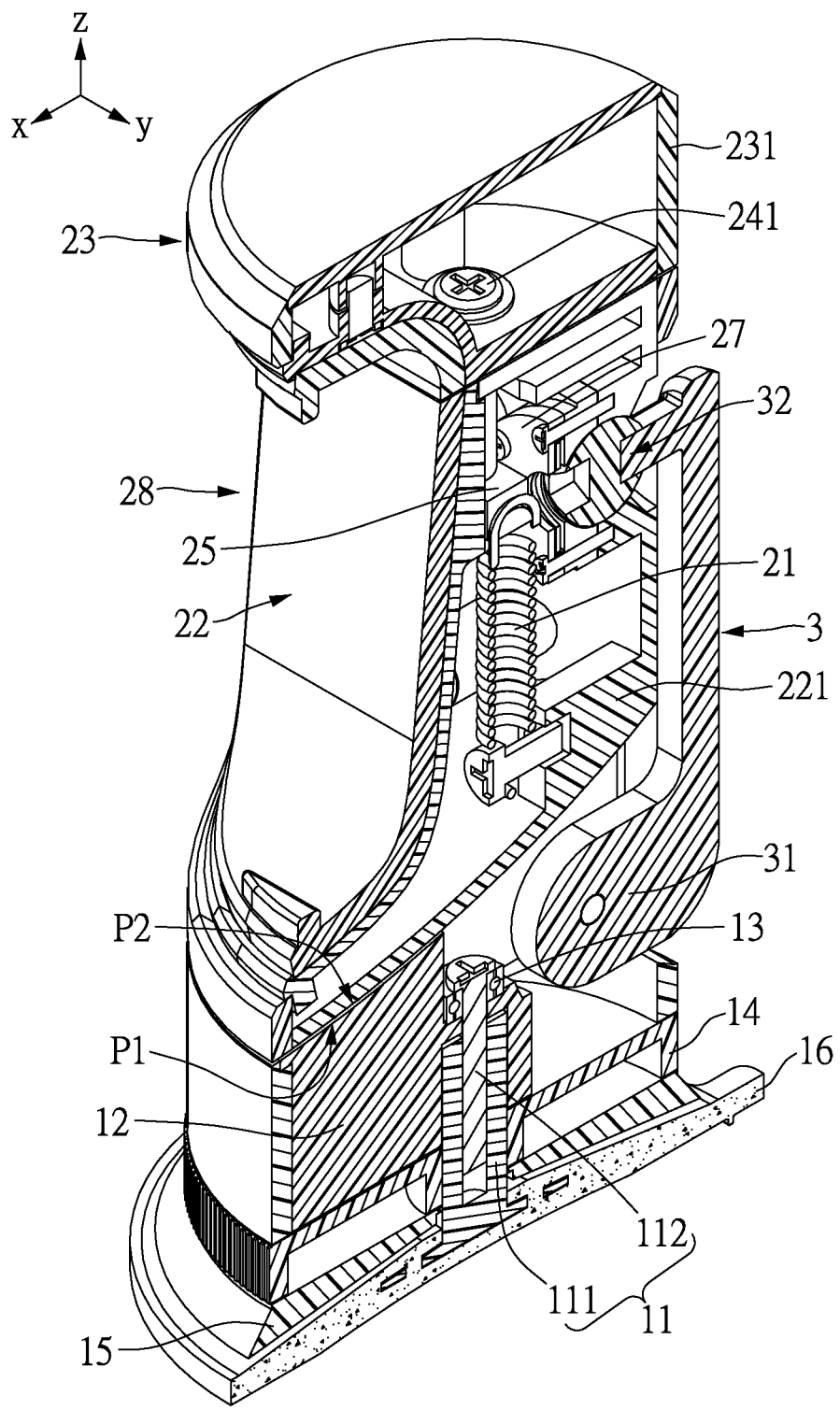
FIG. 4A is a partial stereogram of a holder mechanism shown in FIG. 1A taken along line B-B'.
Figure 4B:
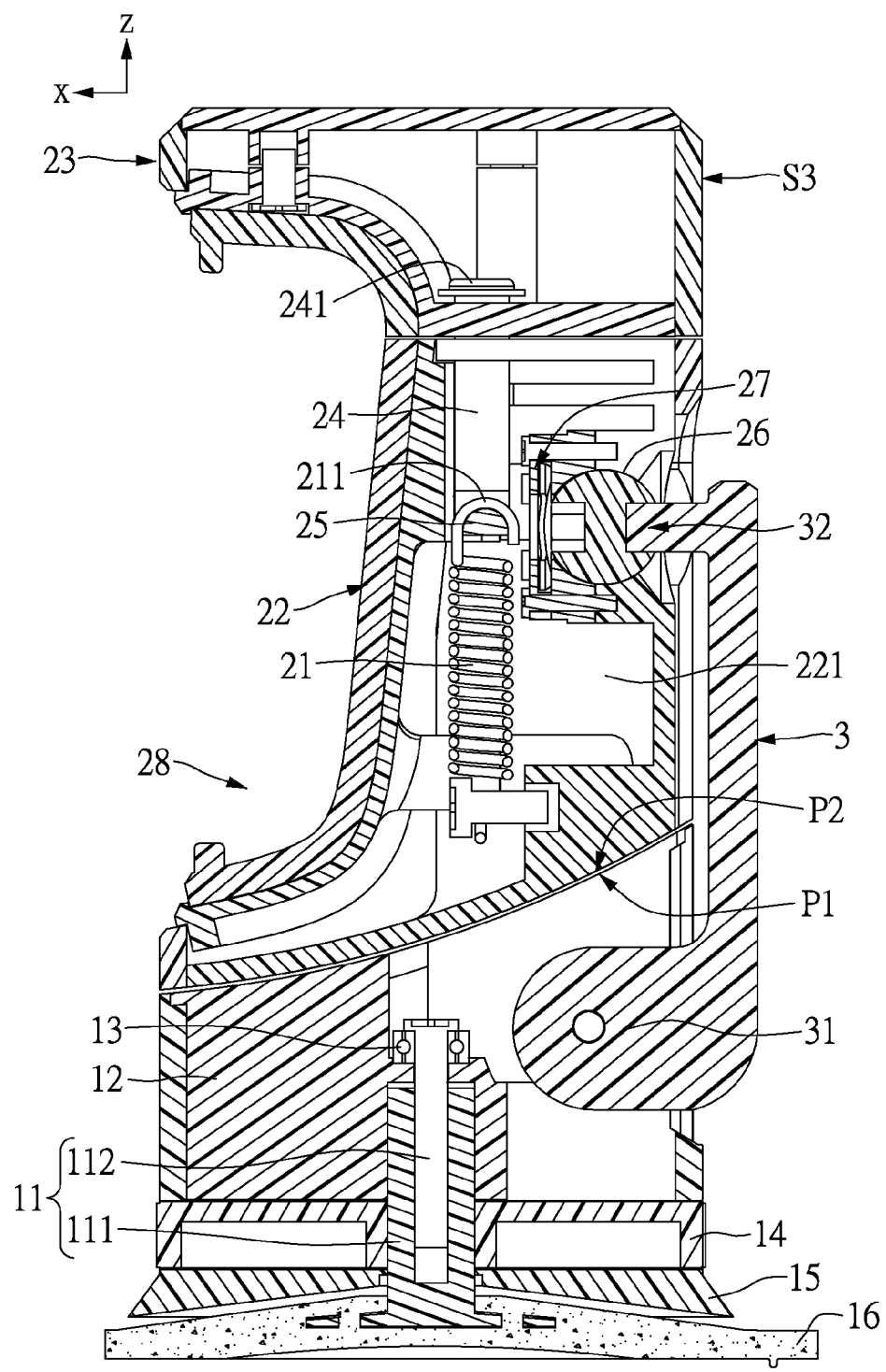
FIG. 4B is a cross-sectional view of a holder mechanism shown in FIG. 1A taken along line B-B'.

Please note that the gripping assembly 2 is movably mounted on the holder base 1. Please refer to FIGS. 4A and 4B. FIG. 4A is a partial stereogram of a holder mechanism shown in FIG. 1A taken along line B-B'. FIG. 4B is a cross-sectional view of a holder mechanism shown in FIG. 1A taken along line B-B'. The connecting bar 3 has a pivot portion 31 and a ball-shaped portion 32. The pivot portion 31 is pivotally connected to the casing 12 of the holder base 2. The ball-shaped portion 32 is connected and arranged in a bowl-shaped notch 26 of the gripping assembly 2 to form a universal joint.

Figure 6:
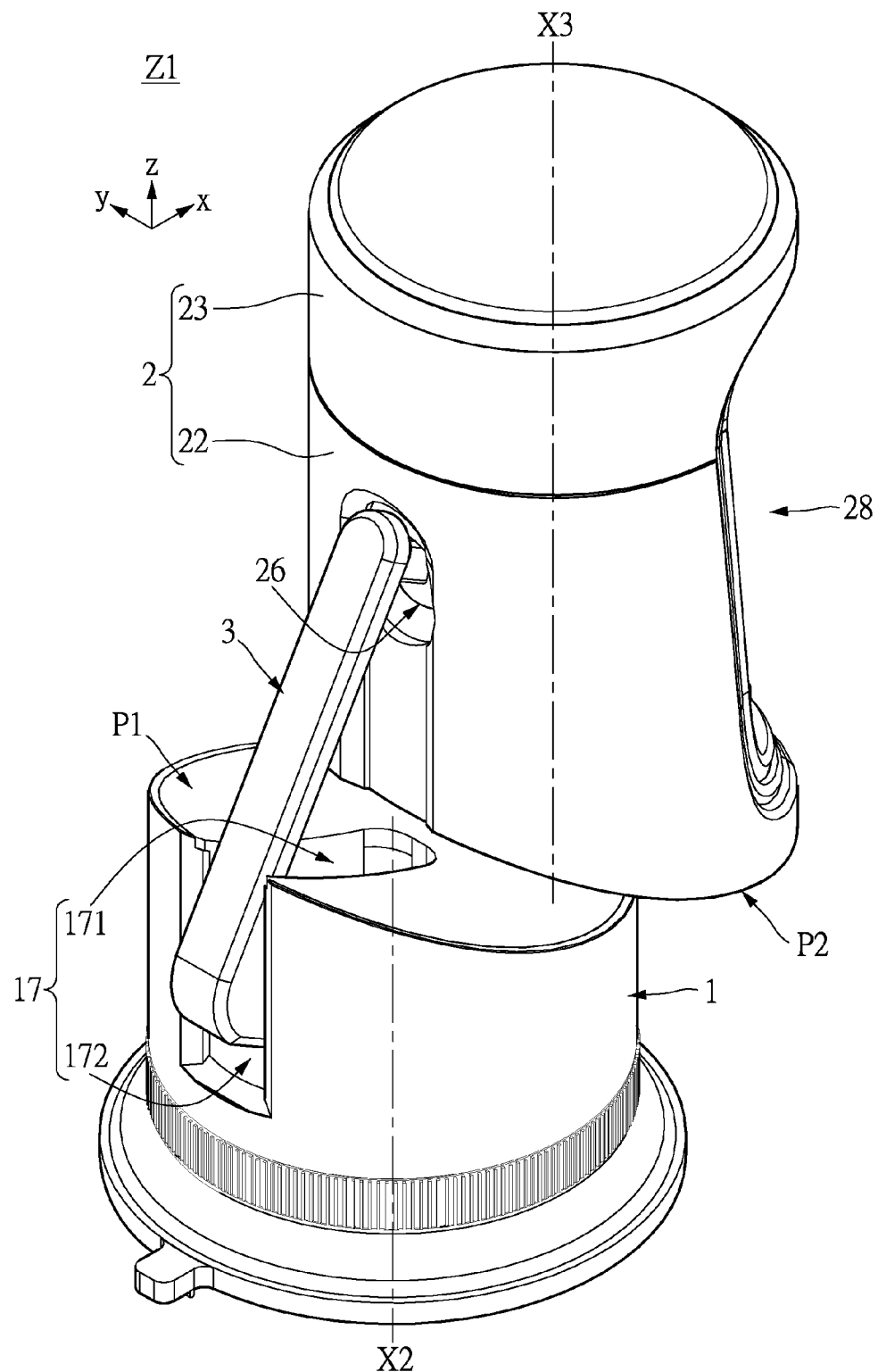
FIG. 6 is a stereogram showing another use state of a holder mechanism shown in FIG. 1A.

Please refer to FIG. 6, which shows another use state of a holder mechanism shown in FIG. 1A. Specifically, the casing 12 of the holder base 1 is formed with a groove 17 having a first opening 171 and a second opening 172. The first opening 171 passes through the upper surface P2 of the gripping assembly 2 and the upper surface P1 of the holder base 1. The second opening 172 is formed at the exterior surface S1 of the holder base 1. The pivot portion 31 of the connecting bar 3 is disposed in the groove 17. In this manner the gripping assembly 2 can be pulled to move away from the holder base 1 and to move forward or else backward with respect to the x-z plane. As shown in FIG. 6, the central axis X2 of the holder base 1 and the central axis X3 of gripping assembly 2 are parallel to the z-axis and away from each other when the gripping assembly 2 is at a second position. That is, the central axis X2 of the holder base 1 and the central axis X3 of the gripping assembly 2 are non-coaxial.

Further, the gripping assembly 2 can rotate freely with respect to the ball-shaped portion 32 of the connecting bar 3 through the universal joint. Furthermore, the gripping assembly 2, as shown in FIG. 2A, includes fixing parts 27. The fixing parts 27 are disposed in the first gripping body 221 corresponding to the bowl-shaped notch 26 and configured to limit the rotary motion of the gripping assembly 2. Accordingly, the gripping assembly 2 can be stopped in the intended position with respect to the holder base 1 through a specified rotary motion.

Please note that the casing 12 can be independently rotated by the bearing structure 13, and in this manner the gripping assembly 2 can be driven to rotate about the central axis X1 of the holder base 1. Besides, the holder mechanism Z1 can be placed on an object surface in a period of the rotation.

Figure 7:
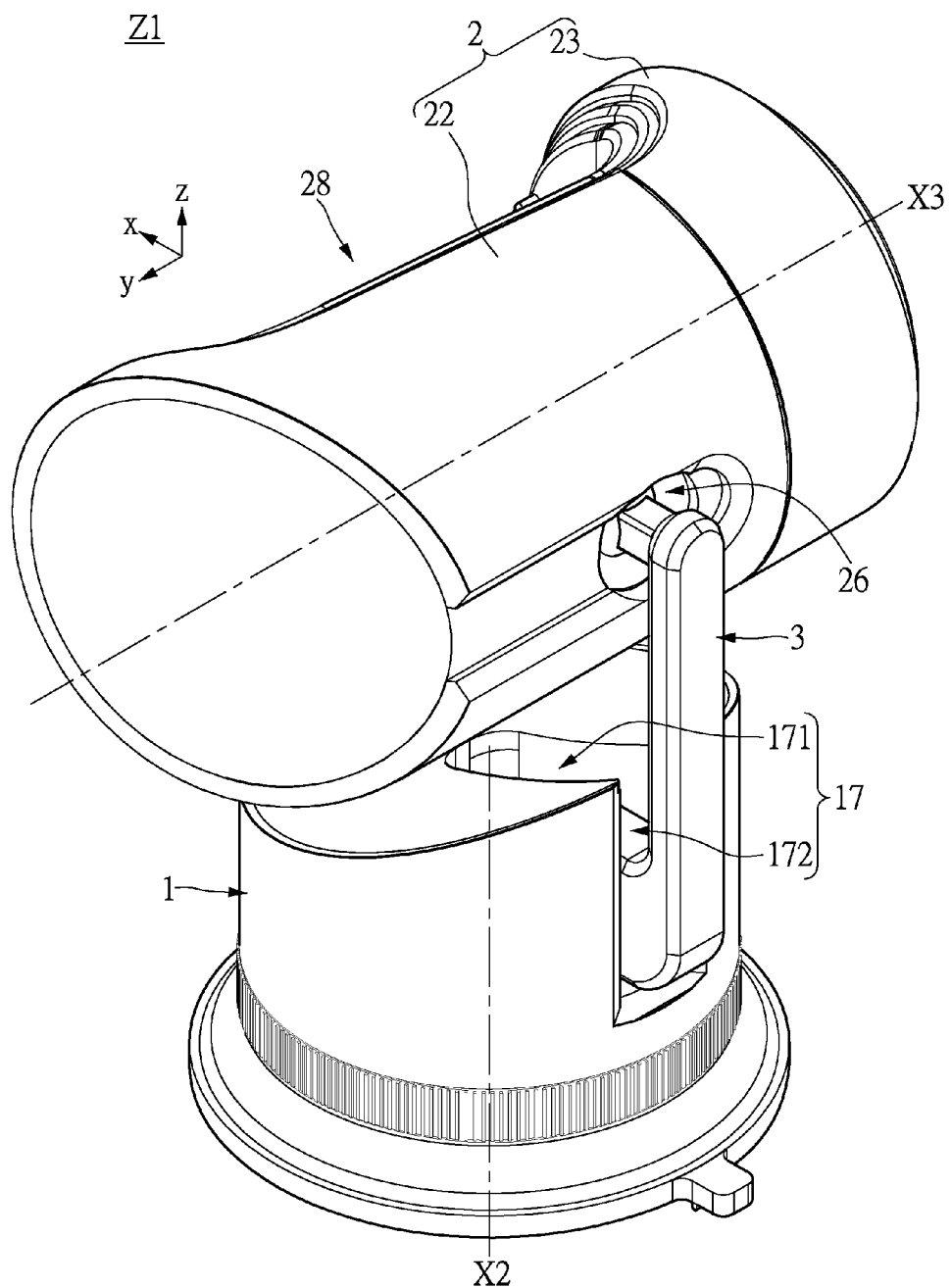
FIG. 7 is a stereogram showing still another use state of a holder mechanism shown in FIG. 1A.

Please refer to FIG. 7, which shows still another use state of a holder mechanism shown in FIG. 1A. The central axis X2 of the holder base 1 is cross to the central axis X3 of the gripping assembly 2 when the gripping assembly 2 is at a third position. For example, the central axis X2 of the holder base 1 is parallel to the z-axis, and the central axis X3 of gripping assembly 2 is parallel to the y-axis.

Referring again to FIG. 5B, the lower surface P2 of the gripping assembly 2 and the upper surface P1 of the holder base 1 overlap each other and at an angle not equal to 90 degrees with respect to the central axis X1 of the gripping assembly 2. In this manner the gripping assembly 2 can be pulled to move away from the holder base 1 and to move forward or else backward with respect to the x-z plane without interference.

Based on the above, the holder mechanism including a pair of gripping assemblies with an elastic element connected therebetween can provide users with a simple way to install a handheld device thereon. When the second gripping module is pulled away from the first gripping module, a resilient force generated by the stretched elastic element will drive the second gripping module to move relative to the first gripping module to grip the handheld device. The holder mechanism, of which a gripping assembly is independently, selectively operable to grip and release a handheld device, can provide multiple gripping configurations.

The descriptions illustrated supra set forth simply the preferred embodiments of the instant disclosure; however, the characteristics of the instant disclosure are by no means restricted thereto. All changes, alterations, or modifications conveniently considered by those skilled in the art are deemed to be encompassed within the scope of the instant disclosure delineated by the following claims.

What is claimed is:

1. A holder mechanism for holding a handheld device, comprising:
    a holder base;
    a gripping assembly movably mounted on the holder base; and
    a connecting bar which has a pivot portion and a ball-shaped portion;
    wherein the gripping assembly includes an elastic element, a first gripping module, and a second gripping module, a first end of the elastic element is fixed to the first gripping module, a second end of the elastic element is fixed to the second gripping module;
    wherein the elastic element is configured to apply a resilient force to the second gripping module to drive the second gripping module to move relative to the first gripping module to grip the handheld device;
    wherein the pivot portion is pivotally connected to the holder base, and the ball-shaped portion is connected and arranged in a bowl-shaped notch of the gripping assembly to form a universal joint.

2. The holder mechanism according to claim 1, further comprising at least one guide element, and the second end of the elastic element is connected to the second gripping module via the at least one guide element.

3. The holder mechanism according to claim 1, wherein when the gripping assembly is at a first position opposite to the holder base, the exterior surface of the gripping assembly is flush with the exterior surface of the holder base.

4. The holder mechanism according to claim 3, wherein the gripping assembly is of a cylinder shape, and the lower surface of the gripping assembly and the upper surface of the holder base overlap each other and at an angle not equal to 90 degrees with respect to a central axis of the gripping assembly.

5. The holder mechanism according to claim 4, wherein the connecting bar is outside the gripping assembly.

6. The holder mechanism according to claim 5, wherein the holder base has a groove having a first opening formed at the upper surface of the gripping assembly and a second opening formed at the exterior surface of the gripping assembly.

7. The holder mechanism according to claim 1, wherein the holder base includes a positioning element, bearing structure, and a casing, the bearing structure is arranged on the positioning element, and the casing is arranged around the positioning element and the bearing structure.

8. The holder mechanism according to claim 7, wherein the positioning element has a first end with a first engaging structure thereon and a second end opposite to the first end, the holder base includes a suction disc and an actuating disc, the suction disc is connected to the second end of the positioning element, the actuating disc has an index hole and a second engaging structure around the index hole, the actuating disc is surroundingly arranged on the first end of the positioning element through the index hole, and the first and second engaging structures are engaged with each other.

9. The holder mechanism according to claim 8, wherein the first engaging structure is an outer screw thread, and the second engaging structure is an inner screw thread corresponding to the outer screw thread.

\* \* \* \* \*